United States Patent
Yamamoto

(10) Patent No.: US 6,483,552 B1
(45) Date of Patent: Nov. 19, 2002

(54) TELEVISION TUNER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/324,520

(22) Filed: Jun. 2, 1999

(30) Foreign Application Priority Data

Jun. 11, 1998 (JP) .......................................... 10-163089

(51) Int. Cl.[7] ................................................ H04N 5/46
(52) U.S. Cl. ....................... 348/729; 348/725; 348/731; 348/512; 455/196.1; 455/255
(58) Field of Search ................................. 348/729, 725, 348/731, 732, 736, 733, 505, 512; 455/196.1, 255, 260; H04N 5/46

(56) References Cited

U.S. PATENT DOCUMENTS

| | | | | |
|---|---|---|---|---|
| 4,322,751 A | * | 3/1982 | Hongu et al. ................ | 348/735 |
| 5,950,112 A | * | 9/1999 | Hori et al. .................... | 348/725 |
| 5,956,098 A | * | 9/1999 | Mizukami et al. ........... | 348/555 |
| 6,020,936 A | * | 2/2000 | Brekelmans ................. | 348/553 |
| 6,125,269 A | * | 9/2000 | Brekelmans .................... | 334/1 |
| 6,177,964 B1 | * | 1/2001 | Birleson et al. ............. | 348/725 |
| 6,211,925 B1 | * | 4/2001 | Kikuchi ....................... | 348/729 |
| 6,344,881 B1 | * | 2/2002 | Endo ............................ | 348/706 |
| 6,353,462 B1 | * | 3/2002 | Osada et al. ................. | 348/705 |
| 2001/0024241 A1 | * | 9/2001 | Osada et al. ................. | 348/729 |

FOREIGN PATENT DOCUMENTS

JP             9-116582             5/1997

\* cited by examiner

*Primary Examiner*—John Miller
*Assistant Examiner*—Linus H Lo
(74) *Attorney, Agent, or Firm*—Brinks Hofer Gilson & Lione

(57) ABSTRACT

This television tuner comprises a mixer 1c for frequency converting each of a television signal and an FM broadcasting signal into an intermediate signal, a local oscillator for outputting a local oscillation signal to the mixer, and a PLL circuit for setting the frequency of the local oscillation signal in correspondence with the frequency of the television signal or the frequency of the FM broadcasting signal. The step frequency of the PLL circuit in the event of receiving the television signal and that in the event of receiving the FM broadcasting signal are made different. The step frequency in the event of receiving the television signal is set to 31.25 kHz and that in the event of receiving the FM broadcasting signal is set to 50 kHz.

2 Claims, 2 Drawing Sheets

| RECEPTION BAND | | OUTPUT PORT | P1 | P2 | P3 | P4 |
|---|---|---|---|---|---|---|
| TV | UHF | | — | — | — | BS4 |
| | VHF/Hi | | — | BS2 | — | — |
| | VHF/Lo | | BS1 | — | — | — |
| FM | | | BS1 | — | BS3 | — |

TELEVISION TUNER

BACKGROUND OF THE INVENTION

1. Field of the Invention

The present invention relates to a television tuner which controls the oscillation frequency of a local oscillator by using a PLL circuit and can receive both a television signal and an FM broadcasting signal.

2. Related Art

A conventional television tuner comprises, as shown in FIG. 4, a VHF tuner 21, a UHF tuner 22, a PLL circuit 23, and a station selection control circuit 24. A VHF band television signal TV and an FM broadcasting signal FM are supplied to the VHF tuner 21 and a UHF band television signal TU is supplied to the UHF tuner 22. The VHF tuner 21 has an FM switching circuit 21a for performing switching between the VHF band television signal TV and the FM broadcasting signal FM and receiving the switched signal, a tuning circuit 21b, a mixer 21c, a local oscillator 21d, and the like. An intermediate frequency signal IF is outputted from the mixer 21c.

The tuning circuit 21b can be switched between a case of receiving a television signal in the high band of the VHF band and a case of receiving a television signal in the low band of the VHF band. The FM broadcasting signal can be received in a state where the tuning circuit 21b is switched to receive the television signal in the low band of the VHF band. Although not illustrated, the UHF tuner 22 has also a tuning circuit, a mixer, and the like and an intermediate frequency signal of the UHF band television signal is outputted via the mixer 21c of the VHF tuner 21.

The PLL circuit 23 comprises a first fixed frequency divider 23a, a variable frequency divider 23b, a phase comparator 23c, a low pass filter 23d, a second fixed frequency divider 23e, and a reference oscillator 23f. The first fixed frequency divider 23a, the variable frequency divider 23b, the phase comparator 23c, and the low pass filter 23d construct a closed loop with the local oscillator 21d. The first fixed frequency divider 23a divides the frequency of a local oscillation signal outputted from the local oscillator 21d at a predetermined frequency dividing ratio. The variable frequency divider 23b further divides the frequency of the local oscillation signal divided by the fixed frequency divider 23a on the basis of frequency dividing ratio data DA outputted from the channel selection control circuit 24 in correspondence with the frequency of a reception channel and outputs the resultant signal to the phase comparator 23c.

Meanwhile, a reference oscillation signal outputted from the reference oscillator 23f is also divided by the second fixed frequency divider 23e, thereby obtaining a reference frequency. The reference frequency is supplied to the phase comparator 23c. The phase comparator 23c compares the phases of two signals and outputs an error signal corresponding to the phase difference to the low pass filter 23d. The low pass filter 23d smoothes the error signal into a DC voltage. The DC voltage is used as a control voltage and applied to a varactor diode (not shown) in the local oscillator 21d, thereby controlling the frequency of the local oscillation signal outputted from the local oscillator 21d to be stable.

The station selection control circuit 24 receives a station selection signal S from a station selection operating unit in a television receiver (not shown), outputs the frequency dividing ratio data DA to the variable frequency divider 23b and outputs switching voltages BS1 to BS4 to the VHF tuner 21 and the UHF tuner 22. The switching voltage BS1 is outputted when the low-band television signal is received. The switching voltage BS2 is outputted when the high-band television signal is received. The switching voltage BS3 is outputted when the FM broadcasting signal is received. The switching voltage BS4 is outputted when the UHF band television signal is received. The switching voltages BS1 and BS2 are supplied to the tuning circuit 21b in the VHF tuner 21. The switching voltage BS3 is supplied to the FM switching circuit 21a in the VHF tuner 21. The switching voltage BS4 is supplied to the UHF tuner 22.

The tuning circuit 21b is switched so as to be tuned to the television signal in the low band of the VHF band and the FM broadcasting signal by the switching voltage BS1. The tuning circuit 21b is switched so as to be tuned to the television signal in the high band of the VHF band by the switching voltage BS2. The FM switching circuit 21a outputs the FM broadcasting signal to the tuning circuit 21b by the switching voltage BS3. Further, the switching voltage BS4 makes the UHF tuner 22 operative.

Each of the VHF television signal TV and the UHF television signal TU which are supplied to the television tuner has two kinds of television signals; what is called a ground wave television signal and a cable television signal sent via a cable (called a CATV signal). The ground wave television signal is according to what is called a standard frequency arrangement. The frequency of the CATV signal is, however, often slightly deviated from the frequency of the corresponding ground wave television signal. This is generally called an offset. The offset frequency lies within a range from few kHz to ten-odd kHz. The step frequency of the PLL circuit 23 is generally set to not 50 kHz but 31.25 kHz so as to be received even by an offset channel.

The step frequency indicates the minimum frequency interval of local oscillation signals outputted from the local oscillator 21d and is determined by the comparison frequency supplied to the phase comparator 23c and the frequency dividing ratio of the fixed frequency divider 23a. Generally, the oscillation frequency of the reference oscillator 23f is set to 4 MHz and the frequency dividing ratio of the second fixed frequency divider 23e is set to 1024, so that the reference frequency is 4000/1024=3.90625 kHz. In order to set the step frequency to 31.25 kHz, the frequency dividing ratio of the fixed frequency divider 23a is set to 31.25/3.90625=8.

The FM broadcasting signal is outputted at intervals of 100 kHz and, moreover, the frequency minimum unit is 100 kHz. When the step frequency of the PLL circuit 23 is 31.25 kHz, the oscillation frequency of the local oscillator 21d is therefore deviated from each of many FM broadcasting frequencies by ten-odd kHz. The sound quality of the FM broadcasting consequently deteriorates.

SUMMARY OF THE INVENTION

Accordingly, it is an object of the invention to provide a television tuner in which the step frequency of the PLL circuit 23 when the FM broadcasting signal is received is made different from that when the television signal is received, thereby realizing just-tuning of the FM broadcasting signal.

In order to solve the problem, there is provided a television tuner capable of receiving both of a television broadcast and an FM radio broadcast, comprising: a mixer for frequency converting a signal of each of the broadcasts into an intermediate frequency signal; a local oscillator for supplying a local oscillation signal to the mixer; and a PLL circuit for controlling the frequency of the local oscillation signal, wherein the PLL circuit varies the frequency of the local oscillation signal in accordance with the case of receiving the television broadcast and the case of receiving the FM radio broadcast by using different step frequencies.

Preferably, according to the television tuner, the PLL circuit comprises: a reference oscillator for outputting an oscillation signal of a predetermined frequency; a reference frequency divider for dividing the frequency of the oscillation signal and outputting the resultant signal as a reference oscillation signal; and a comparison frequency divider for dividing the frequency of the local oscillation signal outputted from the local oscillator and outputting the resultant signal as a comparison signal, the frequency dividing ratio of the reference frequency divider is switched between the case of receiving the television broadcast and the case of receiving the FM radio broadcast to thereby change the frequency dividing step frequency of the local oscillation signal in accordance with the time of receiving the television broadcast and the time of receiving the FM radio broadcast, and the frequency dividing ratio of the comparison frequency divider is switched, thereby changing the frequency of the local oscillation signal.

Preferably, according to the television tuner, the reference frequency divider has a frequency dividing ratio switching terminal and its frequency dividing ratio is switched when a reception switching voltage for switching a broadcast to be received from the television broadcast to the FM radio broadcast is applied to the frequency dividing ratio switching terminal.

Preferably, according to the television tuner, the frequency dividing step frequency of the local oscillation signal is set to 31.25 kHz in the event of receiving the television broadcast and to 50 kHz in the event of receiving the FM radio broadcast.

DETAILED DESCRIPTION OF THE PREFERRED EMBODIMENT

Figure 1:
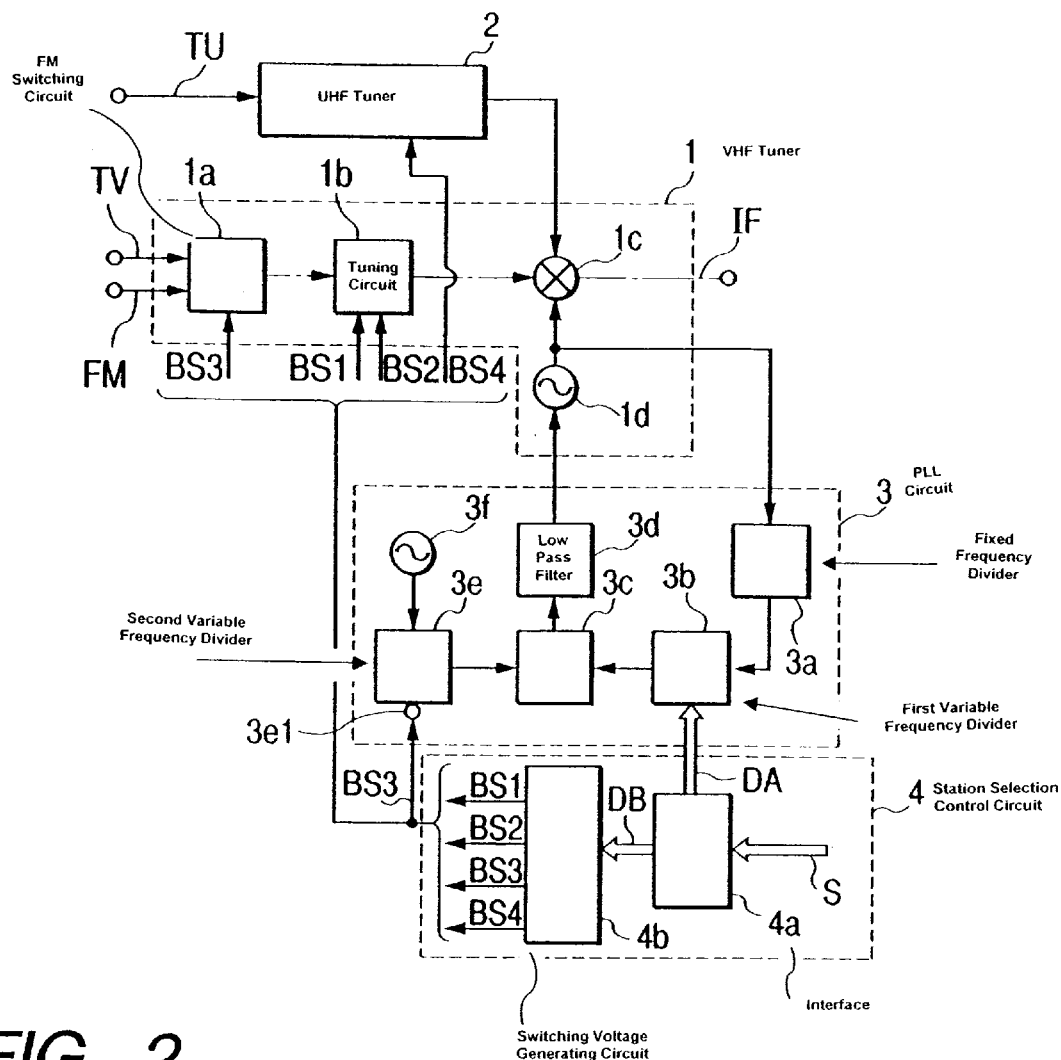
FIG. 1 is a circuit diagram showing a construction of a television tuner of the invention.

A television tuner of the invention comprises, as is illustrated in FIG. 1, a VHF tuner 1, a UHF tuner 2, a PLL circuit 3, and a station selection control circuit 4. The operations of the VHF tuner 1, the UHF tuner 2, and the PLL circuit 3 are controlled by the station selection control circuit 4. The VHF band television signal TV and the FM broadcasting signal FM are supplied to the VHF tuner 1 and the UHF band television signal TU is supplied to the UHF tuner 2.

The VHF tuner 1 comprises an FM switching circuit 1a for performing switching between the VHF band television signal TV and the FM broadcasting signal FM and receiving the switched signal, a tuning circuit 1b, a mixer 1c, a local oscillator 1d, and the like and an intermediate frequency signal IF is outputted from the mixer 1c. The tuning circuit 1b is switched between the case of tuning to the high band of the VHF band and the case of tuning to the low band of the VHF band. The FM broadcasting signal is receivable in a state where the tuning circuit 1b is switched so as to be tuned to the low band of the VHF band. The oscillation frequency of the local oscillator 1d is controlled by the PLL circuit 3. Although not illustrated, the UHF tuner 2 also has a tuning circuit, a mixer, and a local oscillator, and the like, and the intermediate frequency signal from the UHF tuner 2 is outputted via the mixer 1c of the VHF tuner 1. Although the oscillation frequency of the local oscillator of the UHF tuner 2 is also controlled by the PLL circuit 3, it is not illustrated.

The PLL circuit 3 comprises a fixed frequency divider 3a, a first variable frequency divider 3b, a phase comparator 3c, a low pass filter 3d, a second variable frequency divider 3e, and a reference oscillator 3f. The fixed frequency divider 3a, the first variable frequency divider 3b, the phase comparator 3c, and the low pass filter 3d construct a closed loop with the local oscillator 1d. The fixed frequency divider 3a divides the frequency of a local oscillation signal outputted from the local oscillator 1d at a predetermined frequency dividing ratio. The first variable frequency divider 3b further divides the frequency of the local oscillation signal divided by the fixed frequency divider 3a on the basis of the frequency dividing ratio data DA outputted from the station selection control circuit 4 in correspondence with a reception channel (or reception frequency) and outputs the resultant signal to the phase comparator 3c. In this case, the frequency dividing ratio of the fixed frequency divider 3a is set to 8.

Meanwhile, a reference oscillation signal outputted from the reference oscillator 3f is subjected to the frequency division by the second variable frequency divider 3e and the resultant signal is supplied as a comparison frequency to the phase comparator 3c. The phase comparator 3c compares the phases of two signals and outputs an error signal according to the phase difference to the low pass filter 3d. The low pass filter 3d smoothes the error signal into a DC voltage and applies the DC voltage as a control voltage to a varactor diode (not illustrated) in the local oscillator 1d, thereby controlling the frequency of the local oscillation signal outputted from the local oscillator 1d to be constant.

The second variable frequency divider 3e has at least two frequency dividing ratios of 1/1024 and 1/640 and comprises a frequency dividing ratio switching terminal 3e1. The frequency dividing ratio is switched between 1/1024 and 1/640 in accordance with a frequency dividing ratio switching voltage (signal) applied to the frequency dividing ratio switching terminal 3e1.

When the frequency of the reference oscillation signal outputted from the reference oscillator 3f is set to 4 MHz, the comparison frequency supplied to the phase comparator 3c is, accordingly, 4000/1024=3.90625 kHz or 4000/640=6.25 kHz. The step frequency of the PLL circuit 3 therefore becomes 3.90625×8=31.25 kHz or 6.25×8=50 kHz.

Figure 2:
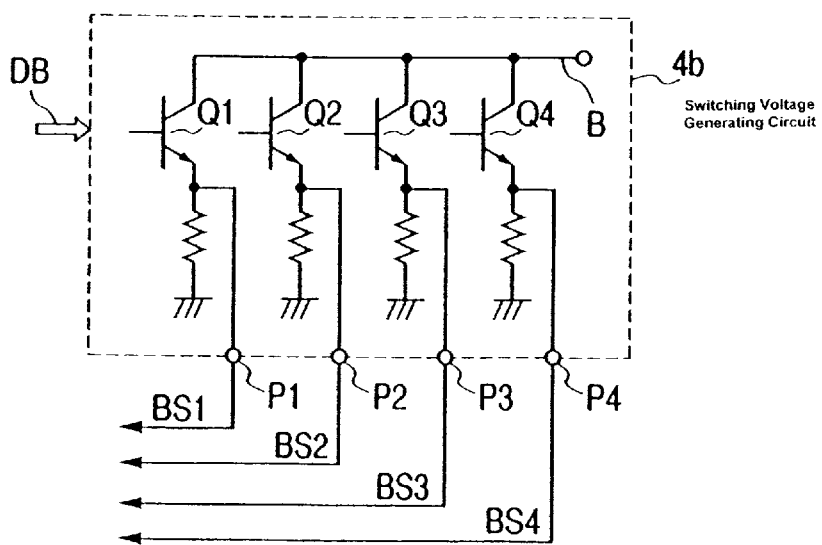
FIG. 2 is a circuit diagram showing a construction of a switching voltage generating circuit in the television tuner of the invention.

The station selection control circuit 4 has an interface 4a and a switching voltage generating circuit 4b, receives station selection data S from a station selection operating unit in a television receiver (not illustrated) and controls the operations of the VHF tuner 1, the UHF tuner 2, and the PLL circuit 3. The station selection data S is, for example, serial data of 19 bits consisting of 4-bit band data and 15-bit frequency data. The interface 4a outputs the frequency dividing ratio data DA for obtaining a predetermined frequency dividing ratio on the basis of the frequency data to the first variable frequency divider 3b. The band data is supplied to the switching voltage generating circuit 4b. The switching voltage generating circuit 4b generates a switching voltage in correspondence with a reception band to which a television signal and the like of the selected station belongs, and controls reception states of the VHF tuner 1 and the UHF tuner 2. As illustrated in FIG. 2, the switching voltage generating circuit 4b has four switching transistors Q1, Q2, Q3, and Q4 and a power source voltage B is applied to their collectors.

Figures 3, 4:
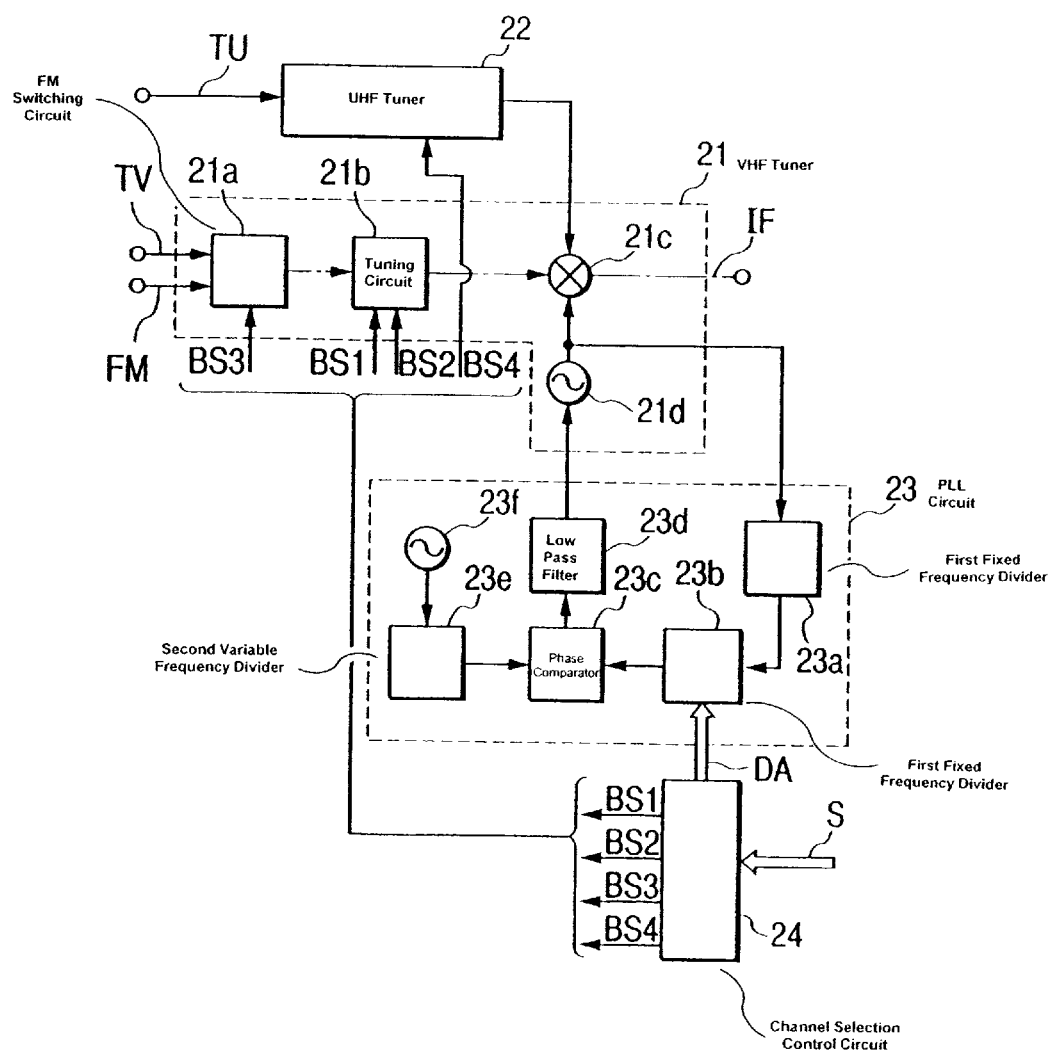
FIG. 3 is a diagram showing the relation between a reception band of the switching voltage generating circuit in the television tuner of the invention and the switching voltage.
FIG. 4 is a circuit diagram showing a construction of a conventional television tuner.

Their emitters serve as output ports P1, P2, P3, and P4 and output switching voltages BS1, BS2, BS3, and BS4, respectively, in correspondence with the reception band of the television signal or the FM signal of the selected station. For example, as shown in FIG. 3, in case of receiving the television signal in the low band of the VHF band (VHF/Lo), the switching voltage BS1 is outputted only to the output port P1. In case of receiving the television signal in the high band of the VHF band (VHF/Hi), the switching voltage BS2 is outputted only to the output port P2. In case of receiving the UHF band television signal (UHF), the switching voltage BS4 is outputted only to the output port BS4. In case of receiving the FM broadcasting signal, the switching voltage BS1 is outputted to the output port P1 and the switching voltage BS3 is outputted to the output port P3. The magnitude of each of the switching voltages BS1 to BS4 is equal to the voltage B applied to the collectors of the switching transistors Q1 to Q4.

The output ports P1 and P2 are connected to the tuning circuit 1b of the VHF tuner 1, the output port P3 is connected to both of the FM switching circuit 1a and the frequency dividing ratio switching terminal 3e1 of the second variable frequency dividing circuit 3e, and the output port P4 is connected to the UHF tuner 2. For example, in case of receiving the television signal in the low band of the VHF band, the voltage BS1 appearing on the output port P1 is supplied to the tuning circuit 1b of the VHF tuner 1 and the tuning circuit 1b is switched so as to be tuned to the low band of the VHF band. In case of receiving the television signal in the high band of the VHF band, the switching voltage BS2 appearing on the output port P2 is supplied to the tuning circuit 1b of the VHF tuner 1 and the tuning circuit 1b is switched so as to be tuned to the high band of the VHF band. In case of receiving the UHF band television signal, the switching voltage BS4 appearing at the output port P4 is supplied to the UHF tuner 2, so that the UHF tuner 2 operates.

Further, in the event of receiving the FM broadcasting signal, the switching voltages BS1 and BS3 appear at the output ports P1 and P3, respectively. The switching voltage BS1 is supplied to the tuning circuit 1b and the tuning circuit 1b is switched so as to be tuned to the low band of the VHF band. On the other hand, the switching voltage BS3 at the output port P3 is supplied to the FM switching circuit 1a, so that the FM broadcasting signal can be received. The switching voltage BS3 at the output port P3 is also supplied to the second variable frequency divider 3e. The frequency dividing ratio of the second variable frequency divider 3e is thus switched from 1/1024 to 1/640 (the frequency dividing ratio of the second variable frequency divider 3e is usually 1/1024 and is switched to 1/640 only when the switching voltage BS3 is supplied).

By switching the frequency dividing ratio of the second variable frequency divider 3e in the PLL circuit 3 as described above, the step frequency of the PLL circuit 3 is changed to 31.25 kHz in the event of receiving the television signal and to 50 kHz in the event of receiving the FM broadcasting signal.

According to the invention, therefore, the television signal whose frequency is offset can be received with reasonable frequency accuracy. In the case where the FM broadcasting signal is received, what is called "just tuning" can be realized.

Moreover, the frequency dividing ratio of the second variable frequency divider 3e can be easily switched by using the switching voltage BS3 to be supplied to the FM switching circuit 1a for performing the switching between the television signal and the FM broadcasting signal in the VHF tuner 1.

According to the television tuner as described above, the frequency of the local oscillation signal is set in correspondence with the frequency of the television signal or the frequency of the FM broadcasting signal. The step frequency of the PLL circuit which is controlled to be constant is changed between the case where the television signal is received and the case where the FM broadcasting signal is received. The step frequency in the event of receiving the television signal is set to 31.25 kHz and that in the event of receiving the FM broadcasting signal is set to 50 kHz, so that the television signal whose frequency is offset can be received with reasonable frequency accuracy. In case of receiving the FM broadcasting signal, what is called "just tuning" can be realized.

According to the television tuner of the invention, the PLL circuit is provided with the second variable frequency divider for dividing the oscillation signal sent from the reference oscillator. The step frequency is varied by switching the frequency dividing ratio of the variable frequency divider. Consequently, the step frequency can be easily changed without changing the construction of the closed loop in the PLL circuit.

According to the television tuner of the invention, the second variable frequency divider has at least two frequency dividing ratios and comprises the frequency dividing ratio switching terminal. In case of receiving the FM broadcasting signal, the switching voltage is supplied to the frequency dividing ratio switching terminal to switch the frequency dividing ratio, thereby making the step frequency different. Thus, the step frequencies can be easily made different from each other by the switching voltage for switching the reception band.

What is claimed is:

1. A television tuner capable of receiving both of a television broadcast and an FM radio broadcast, comprising:

a mixer for frequency converting a signal of each of the television broadcast and FM radio broadcasts into an intermediate frequency signal;

a local oscillator for supplying a local oscillation signal to the mixer; and a PLL circuit for controlling a frequency of the local oscillation signal, wherein the PLL circuit varies the frequency of the local oscillation signal in accordance with the case of receiving the television broadcast and the case of receiving the FM radio broadcast by using different frequencies, wherein the PLL circuit comprises a reference oscillator that outputs an oscillation signal of a predetermined frequency, a reference frequency divider that divides the frequency of the oscillation signal and outputs a resultant signal as a reference oscillation signal, and a comparison frequency divider that divides the frequency of the local oscillation signal outputted from the local oscillator and outputs a resultant signal as a comparison signal, and wherein a frequency dividing ratio of the reference frequency divider is switched between the case of receiving the television broadcast and the case of receiving the FM radio broadcast to thereby change a frequency dividing step of the local oscillation signal in accordance with a time of receiving the television broadcast and a time of receiving the FM radio broadcast, and the frequency dividing ratio of the comparison frequency divider is switched, thereby changing the frequency of the local oscillation signal.

2. A television tuner according to claim 1, wherein the frequency dividing step frequency of the local oscillation signal is set to 31.25 kHz in the event of receiving the television broadcast and to 50 kHz in the event of receiving the FM radio broadcast.

\* \* \* \* \*